United States Patent [19]
Yamada

[11] Patent Number: 5,461,419
[45] Date of Patent: Oct. 24, 1995

[54] PHOTOELECTRIC CONVERSION SYSTEM

[75] Inventor: Hiroyasu Yamada, Hachioji, Japan

[73] Assignee: Casio Computer Co., Ltd., Tokyo, Japan

[21] Appl. No.: 133,657

[22] Filed: Oct. 7, 1993

[30] Foreign Application Priority Data

Oct. 16, 1992 [JP] Japan .................................. 4-304586
Mar. 19, 1993 [JP] Japan .................................. 5-085647

[51] Int. Cl.$^6$ ....................................... H04N 3/14
[52] U.S. Cl. ................... 348/302; 348/307; 257/443; 257/72
[58] Field of Search ........................... 348/302, 303, 348/304, 307, 308, 294, 295, 296, 297, 298; 257/443, 462, 72

[56] References Cited

U.S. PATENT DOCUMENTS

| | | | |
|---|---|---|---|
| 4,344,705 | 8/1982 | Koupa et al. ......................... | 365/5 |
| 4,547,676 | 10/1985 | Suzuki et al. ......................... | 348/296 |
| 4,597,012 | 6/1986 | Itoh et al. ............................. | 348/308 |
| 4,875,091 | 10/1989 | Yamada et al. ..................... | 348/302 |
| 5,028,788 | 7/1991 | Beland et al. ...................... | 257/462 |
| 5,247,193 | 9/1993 | Menda ................................ | 257/462 |
| 5,264,940 | 11/1993 | Komiya et al. .................... | 348/940 |
| 5,276,521 | 1/1994 | Mori ................................... | 348/297 |
| 5,307,169 | 4/1994 | Nagasaki et al. .................. | 348/307 |
| 5,329,372 | 7/1994 | Nakamura ........................... | 348/302 |

FOREIGN PATENT DOCUMENTS 3-82171  4/1991  Japan .

OTHER PUBLICATIONS

Patent Abstracts of Japan, vol. 15, No. 254 (E-1083) Jun. 27, 1991 & JP-A-03 082 171 (Casio Computer Co., Ltd.) Apr. 8, 1991.

Optoelectronic Devices and Technologies deel, 6, No. 2, Dec. 2, 1991, Tokyo, Japan, Nakamura et al "Present Status and Future Prospects of CMD Image Sensor".

Primary Examiner—Donald J. Yusko
Assistant Examiner—Michael Day
Attorney, Agent, or Firm—Frishauf, Holtz, Goodman, Langer & Chick

[57] ABSTRACT

A plurality of photosensors are formed on an insulation substrate in a matrix fashion. Each of the photosensors includes a photoelectric conversion semiconductor, first and second gate electrodes, a drain electrode and a source electrode. A signal line is connected to each drain electrode. After precharge signals are applied to the respective signal lines by driving a switching circuit, a sense voltage is applied to the first gate electrode, a selection voltage is applied to the second gate electrode, while a light beam is supplied to the photoelectric conversion semiconductor. As a result, the precharge voltages held on the signal lines are lowered by voltages corresponding to the intensity of the incident light beam. The voltage remaining on the signal lines is read out from the signal lines by driving the switching circuits, thereby generating a signal having a pulse width with a starting point corresponding to a predetermined high level of the remaining voltage and an end point corresponding to a predetermined low level thereof.

12 Claims, 13 Drawing Sheets

PHOTOELECTRIC CONVERSION SYSTEM

BACKGROUND OF THE INVENTION

1. Field of the Invention

This invention relates to a photoelectric conversion system having a photoelectric conversion device and a detection circuit for detecting an output signal of the photoelectric conversion device.

2. Description of the Related Art

As a photoelectric conversion device, a MOSFET photocell and photodiode using monocrystalline silicon, amorphous silicon, polycrystallinesilicon or the like are known. A CCD is well known in the art as a system for transferring charges generated in the silicon bulk by application of light by scanning an electric field. Because of the charge transfer inside the bulk, in this system, a so-called semiconductor thin film deposition technique for forming a photoelectric conversion device on the insulating substrate cannot be used and this system is not suitable for a photo device of large area. Further, when illumination light is intense, surplus charges are leaked from a pixel portion to the adjacent pixel portion to cause a smear phenomenon or blooming phenomenon that a pixel of black level is observed as a whitish pixel.

An area type photo-array can be formed by arranging photoelectric conversion devices constructed by photodiodes or MOS photocells on the insulating substrate in a matrix form. In this case, charges stored on the respective photoelectric conversion devices by application of illumination light are sequentially derived out at preset timings by effecting the scanning operations in the horizontal and vertical directions. The derivedout charge is amplified by a video amplifier and subjected to the A/D conversion process. Then, gradation display is effected according to the result of the A/D conversion process. Since this type can be made in a large area form and each pixel portion can be made in an island form which is independent from the adjacent pixel portion, the blooming phenomenon and smear phenomenon can be prevented. In order to read out charges generated in the photodiode or MOS photocell by application of illumination light, it is necessary to amplify the charge and then subject the same to the A/D conversion.

A novel photosensor with TFT structure is proposed by the inventor of this application. This invention is disclosed in Japanese Patent Application KOKAI publication No. 3-82171, and the outline thereof is explained with reference to FIGS. 14 and 15.

FIG. 14 is an enlarged cross sectional view of a TFT photosensor 1. The photosensor 1 has a structure having a bottom gate electrode 3, bottom gate insulating film 4, photoelectric conversion semiconductor layer 5 formed of amorphous silicon, source electrode 6, drain electrode 7, top gate insulating film 8 and top gate electrode 9 laminated in this order on a transparent glass substrate 2. The top gate electrode 9 and top gate insulating film 8 are transparent. The source electrode 6 and drain electrode 7 are separated from each other so that light can be illuminated on that portion of the semiconductor layer 5 which lies between the edge portions of the electrodes. Illumination light L is illuminated from the top gate electrode 9 side of the photosensor 1. The operation of the photosensor 1 is explained with reference to FIG. 15.

FIG. 15 shows characteristic curves showing the relation between a drain current $I_D$ and a top gate voltage $V_{TG}$ applied to the top gate electrode 9 using the presence and absence of the illumination light L as parameters in a condition that a bottom gate voltage $V_{BG}$=+20 V is applied to the bottom gate electrode 3 and a drain voltage $V_d$=+10 V is applied between the source electrode 6 and the drain electrode 7. In FIG. 15, the characteristic curve $C_O$ indicates a case of no light illumination and the characteristic curve $C_L$ indicates a case of light illumination.

In the case of no light illumination, n-channels are formed in both of the upper and lower surface layers of the semiconductor layer 5 when the top gate voltage $V_{TG}$=+40 V. As a result, a drain current $I_D$ of several tens micro A (Ampere) can be obtained. The drain current $I_D$ becomes smaller as the top gate voltage $V_{TG}$ becomes lower, and it becomes smaller than $10^{-14}$ A when the top gate voltage $V_{TG}$ becomes approximately equal to −20 V. This is considered to be because the n-channel formed in the lower surface of the semiconductor layer 5 by application of the bottom gate voltage $V_{BG}$=+20 V is cancelled by application of the top gate voltage $V_{TG}$=−20 V. In the case of light illumination, a drain current $I_D$ which is as large as several tens micro A as in the case of no light illumination flows at the time of application of the top gate voltage $V_{TG}$=+40 V as might be expected. Unlike the case of no light illumination, the drain current $I_D$ will not be significantly reduced when the top gate voltage $V_{TG}$ is lowered and a current of approx. 1 micro A will flow even when the top gate voltage $V_{TG}$ is lowered to −40 V. Therefore, in the photosensor 1, an excellent characteristic in which the ratio of a current (light current) in the case of light illumination to a current (dark current) in the case of no light illumination is set to a number in seven figures can be obtained.

However, even in the above photosensor, only the signal-to-noise ratio can be increased, and like the conventional photodiode and MOS photocell, in order to read out stored charges, it is required to amplify the charge by use of a video amplifier and subject the same to the A/D conversion process. As a result, the sense amplifier is made complicated in construction and the sense amplifier cannot be formed without using a monocrystalline bulk at the present stage and becomes expensive and large in size.

This invention is made in the above-described situations and an object of this invention is to provide a novel photoelectric conversion system which can be designed to detect a current generated in the photoelectric conversion device by application of illumination light by use of a circuit of simple construction.

SUMMARY O THE INVENTION

According to the present invention, there is provided photoelectric conversion system comprising a photoelectric conversion system comprising photoelectric conversion means (10) for generating charges corresponding to an amount of illumination light (L), measuring means (34; 54) for measuring time required for an output of the photoelectric conversion means (10) to vary from a preset value to another preset value; and output means (35; 55) for deriving an output signal corresponding to the illumination light (L) based on the result of measurement obtained by the measuring means (34; 54).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

There will now be described embodiments of this invention with reference to the accompanying drawings.

FIGS. 1 to 9 illustrate one embodiment of a photosensor system and photosensors used in the photosensor system.

Figure 1:
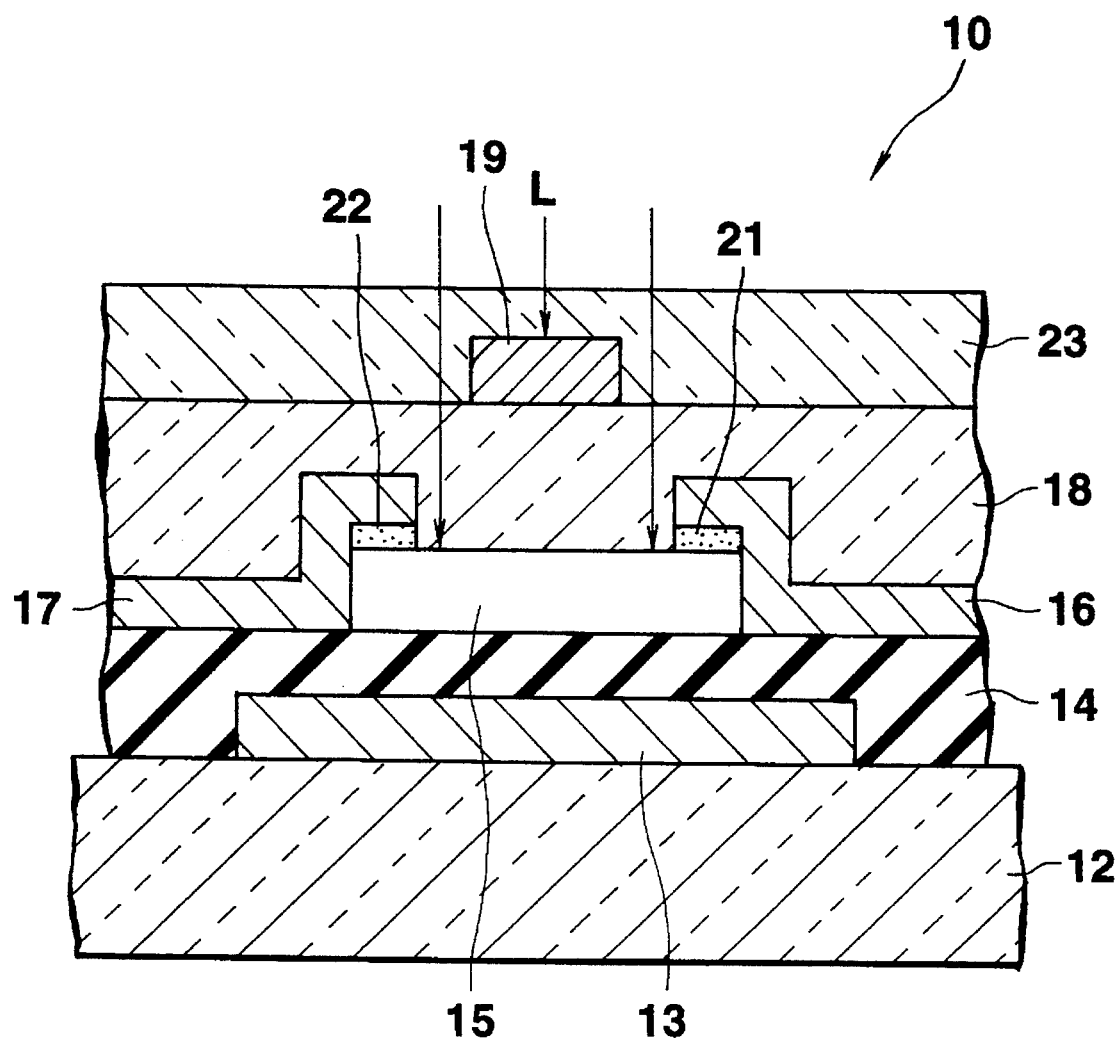
FIG. 1 is an enlarged cross sectional view of a TFT photosensor used in a photosensor system according to a first embodiment of this invention.

As shown in FIG. 1, a photosensor 10 has a basic structure obtained by combining an inverted stagger type thin film transistor and a coplanar type thin film transistor with the semiconductor layers thereof formed as a single layer.

That is, the photosensor 10 has a bottom gate electrode 13 formed on a transparent insulative substrate 12 formed of glass or the like and a bottom gate insulating film 14 formed of silicon nitride (SIN) to cover the bottom gate electrode 13 made of conductive material. A semiconductor layer 15 is formed in position above the bottom gate electrode 13 to face the bottom gate electrode 13 and the semiconductor layer 15 is formed of i-type amorphous silicon (i-a-Si). A source electrode 16 and a drain electrode 17 are formed on both sides of the semiconductor layer 15 and in positions on the semiconductor layer 15 to face each other with a preset distance set therebetween and the source electrode 16 and the drain electrode 17 are connected to the semiconductor layer 15 via respective $n^+$ silicon layers 21 and 22 formed of amorphous silicon diffused with dopant such as phosphorus. A bottom transistor (inverted stagger type thin film transistor) is constructed by the above elements.

The source electrode 16, drain electrode 17 and a portion of the semiconductor layer 15 which lies between the source electrode 16 and drain electrode 17 are covered with a transparent top gate insulating film 18 formed of silicon nitride and a top gate electrode 19 is formed on the film 18 in a position to face the bottom gate electrode 13. The top gate electrode 19 is formed of a light shielding material with a width smaller than the length of a portion of the semiconductor layer 15 which lies between the source electrode 16 and the drain electrode 17 so as to cover part of the central area of the semiconductor layer 15 between the source electrode 16 and the drain electrode 17. A transparent overcoat film 23 formed of silicon nitride is formed to cover the top gate electrode 19 and the top gate insulating film 18 so as to protect them. A top transistor (coplanar transistor) is constructed by the top gate electrode 19, top gate insulating film 18, semiconductor layer 15, source electrode 16 and drain electrode 17.

As shown in FIG. 1, in this embodiment, the photosensor 10 is applied with illumination light L from the top gate electrode 19 side and the illumination light L is applied to the semiconductor layer 15 via the top gate insulating film 23, but the illumination light is shielded by the top gate electrode 19.

For example, the photosensor 10 is formed such that the bottom gate electrode 13 is 1000 angstroms thick, the bottom gate insulating film 14 is 2000 angstroms thick, the semiconductor layer 15 is 1500 angstroms thick, the source electrode 16 and drain electrode 17 are 500 angstroms thick, the ohmic contact layers 21 and 22 are 250 angstroms thick, the top gate insulating film 18 is 2000 angstroms thick, the top gate electrode 19 is 500 angstroms thick, and a distance between the source electrode 16 and the drain electrode 17 on the semiconductor layer 15 is set to 7 μm, for example, and the top gate electrode 19 is formed with a width smaller than 7 μm.

Next, the operation is explained.

Figure 2:
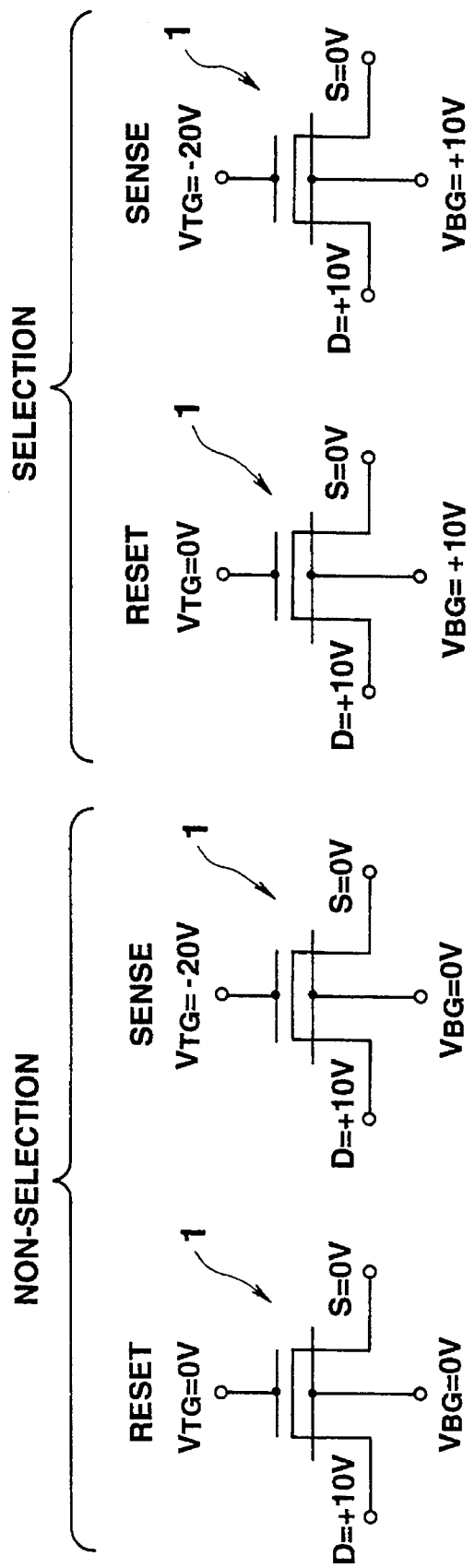
FIG. 2 is a diagram showing an equivalent circuit of the photosensor shown in FIG. 1 and illustrating a method for driving the photosensor.

The equivalent circuit of the photosensor 10 is shown in FIG. 2. In FIG. 2, $V_{TG}$ denotes a top gate voltage applied to the top gate electrode 19, and $V_{BG}$ denotes a bottom gate voltage applied to the bottom gate electrode 13. When a positive voltage, for example, $V_{BG}$=+10 V is applied to the bottom gate electrode 13 of the photosensor 10 to form an n-channel in the bottom transistor and a positive drain voltage, for example, +10 V is applied between the source electrode 16 and the drain electrode 17, electrons are supplied from the source electrode 16 side, thus causing a current to flow. In this condition, if a negative voltage of level for extinguishing the channel by an electric field created by the bottom gate electrode 13, for example, $V_{TG}=-20$ V is applied to the top gate electrode 19, the electric field from the top gate electrode 19 acts to reduce the influence given to the channel region by the electric field created by the bottom gate electrode 13, and as a result, a depletion layer extends in the thickness direction of the semiconductor layer 15 to pinch off the n-channel. At this time, if illumination light L is applied on the top gate electrode 19 side, electron-hole pairs are generated in portion of the semiconductor layer 15 on the top gate electrode 19 side. In this case, since $V_{TGb}=-20$ V is applied to the top gate electrode 19, induced electron-hole pairs are stored in the channel region to extinguish the electric field created by the top gate electrode 19. For this reason, an n-channel is formed in the channel region of the semiconductor layer 15, causing a current to flow. In this case, a current (which is hereinafter referred to as a drain current) $I_{DS}$ flowing between the source electrode 16 and the drain electrode 17 varies according to an amount of illumination light L.

Thus, since the electric field from the top gate electrode 19 side is controlled to prevent formation of a channel to be formed by the electric field from the bottom gate electrode 13 side and pinch off the n-channel, the drain current $I_{DS}$ flowing at the time of no light illumination can be suppressed to an extremely small value, for example, approx. $10^{-14}$ A. As a result, in the photosensor 10, a difference between the drain current at the time of light illumination and the drain current at the time of no light illumination can be made sufficiently large, and the amplification factor of the bottom transistor varies with an amount of illuminated light and the S/N ratio can be made large.

Further, in the photosensor 10, if the top gate electrode 19 is set to, for example, $V_{TG}=0$ V in a state that a voltage $V_{BG}=+10$ V is applied to the bottom gate electrode 13, holes are discharged from the trap level between the semiconductor layer 15 and the top gate insulating film 18 to effect the refresh operation, that is, resetting operation. More specifically, when the photosensor 10 is continuously used, the trap level between the semiconductor layer 15 and the top gate insulating film 18 is filled with holes generated by light illumination and holes injected from the drain electrode 17, the channel resistance in the no light illumination state becomes small, and the drain current increases at the time of no light illumination. Therefore, 0 V is applied to the top gate electrode 19 to discharge the holes, thus effecting the resetting operation.

Further, when a positive voltage is not applied to the bottom gate electrode 13 in the photosensor 10, no channel is formed in the bottom transistor so that a drain current will not flow even when light is illuminated, thereby setting up a non-selection state. That is, the photosensor 10 can be set to the selection state and non-selection state by controlling the bottom gate voltage $V_{BG}$ applied to the bottom gate electrode 13. Further, when $V_{TG}=0$ V is applied to the top gate electrode 19 in the non-selection state, holes are discharged from the trap level between the semiconductor layer 15 and the top gate insulating film 18 to effect the resetting operation in the same manner as described above.

Thus, the photosensor 10 can be set to the sense state and reset state by controlling the voltage $V_{TG}$ applied to the top gate electrode 19 to, for example, 0 V and −20 V and control the selection state and non-selection state by controlling the voltage VBG applied to the bottom gate electrode 13 to, for example, 0 V and +10 V. As a result, the photosensor 10 can be operated as a photosensor having both of the photosensor function and the selection transistor function by controlling the voltages applied to the top gate electrode and bottom gate electrode.

Figure 3:
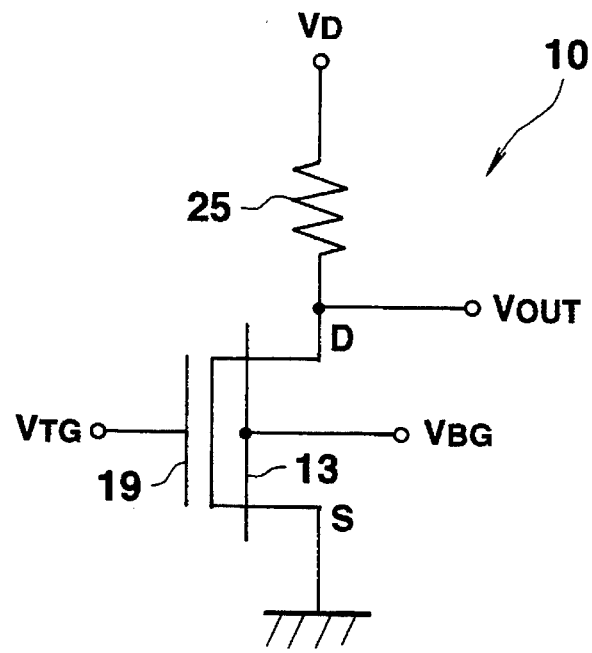
FIG. 3 is a circuit diagram showing the state for reading out an output signal $V_{OUT}$ of the photosensor shown in FIG. 1.
Figure 4:
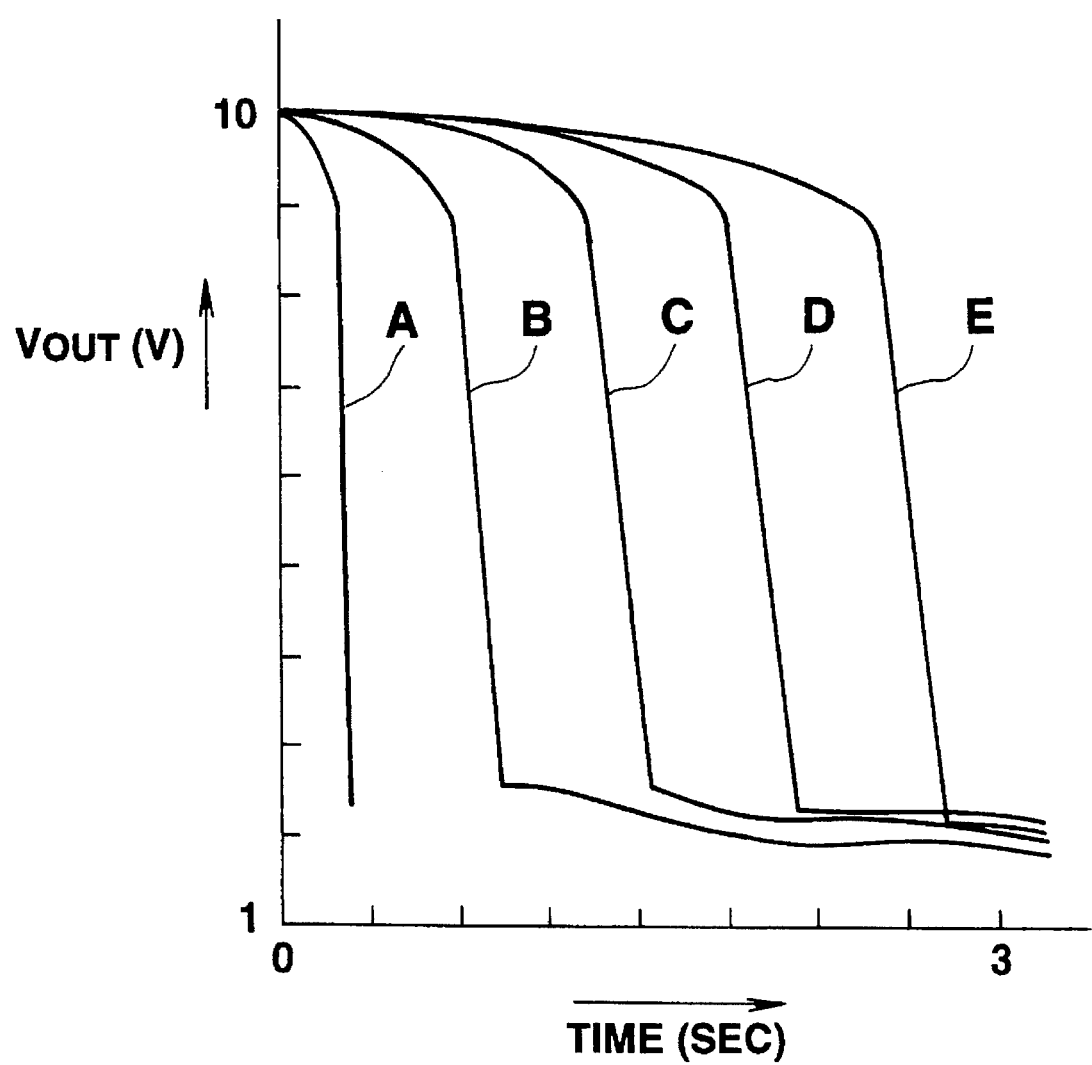
FIG. 4 is a characteristic curve diagram showing the relation between the output signal $V_{OUT}$ and time after the light illumination with the illuminance of the illumination light L used as a parameter.

The output characteristic as shown in FIG. 4 can be obtained by checking the output signal $V_{OUT}$ of the photosensor 10 while changing the illumination light L with the photosensor 10 applied with such voltages as shown in FIG. 3.

Figure 5:
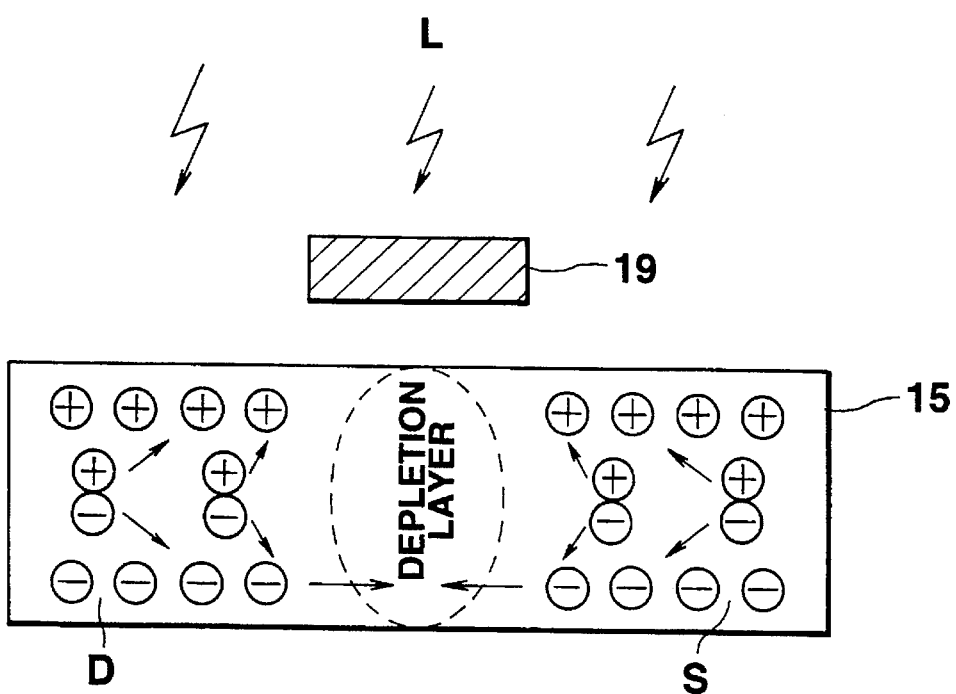
FIG. 5 is a conceptional view for illustrating the operation of the photosensor shown in FIG. 1.

That is, as shown in FIG. 3, a load resistor 25 of 10 megaohm is connected to the drain electrode 17 of the photosensor 10, a drain voltage $V_D=+10$ V is applied to the drain electrode 17 via the load resistor 25, and a bottom gate voltage $V_{BG}=+10$ V is applied to the bottom gate electrode 13. It is assumed that the reset state and sense state can be selectively set by applying a top gate voltage $V_{TG}=0$ V or −20 V to the top gate electrode 19. If the top gate voltage $V_{TG}$ is changed from 0 V to −20 V, the photosensor 10 is set into the sense state, but as shown in FIG. 5, a depletion layer is formed in the central portion of the semiconductor layer 15 to pinch off the n-channel. Since this state is a channel cut-off state, the output signal $V_{OUT}$ of the photosensor 10 is set to approx. +10 V which is the same as the drain voltage $V_D$ as shown in FIG. 4. At this time, if the illumination light L is applied, electron-hole pairs are generated in the semiconductor layer 15 as shown in FIG. 5 and holes in the induced electron-hole pairs move towards the drain region D and source region S as indicated by arrows in FIG. 5 and electrons move towards the bottom gate electrode 13. In this case, since the illumination light L is shielded or shaded by the top gate electrode 19 as shown in FIG. 1, a depletion layer is formed in the central area of the channel forming region shaded by the top gate electrode 19 as shown in FIG. 5 at the instant that the illumination light is applied. When an amount of carriers of the electron-hole pairs increases, the carriers gradually move into the depletion layer to fill the pinch-off region as shown by arrows in FIG. 5, and when the carriers penetrate the pinch-off region, the output signal $Y_{OUT}$ of the photosensor 10 is abruptly inverted.

Figure 6:
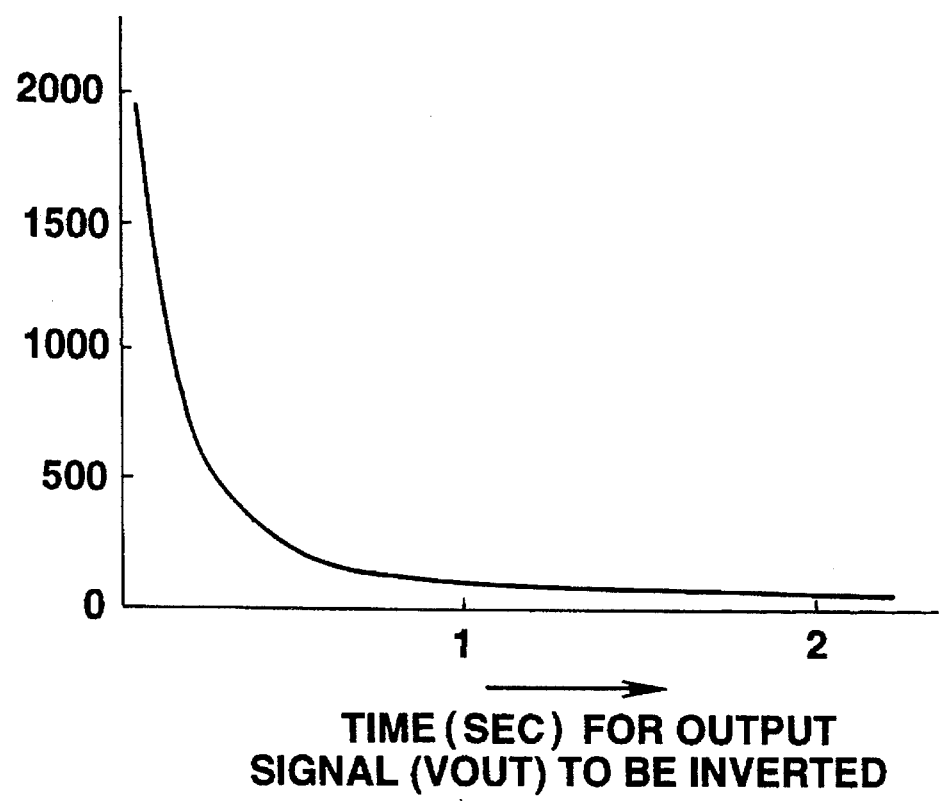
FIG. 6 is a characteristic diagram showing the relation between the illumination light L applied to the photosensor and time necessary for the output signal $V_{OUT}$ of the photosensor to be inverted.

An amount of the electron-hole pairs induced by application of the illumination light L varies with the illuminance intensity of the illumination light L, and as the illuminance is intenser, an amount of the electron-hole pairs increases and time required for the output signal $V_{OUT}$ of the photosensor 10 to be inverted becomes shorter accordingly. Now, the relation between the value of the output signal $V_{OUT}$ and time required for the output signal $V_{OUT}$ to be inverted when the illuminance of the illumination light L is changed in the photosensor 10 of FIG. 3 is checked. As shown by the characteristic curve E obtained when the illuminance is 40 lux, the characteristic curve D obtained when the illuminance is 50 lux, the characteristic curve C obtained when the illuminance is 90 lux, the characteristic curve B obtained when the illuminance is 160 lux, and the characteristic curve A obtained when the illuminance is 500 lux shown in FIG. 4, it is understood that the time for the value of the output signal $V_{OUT}$ to be abruptly lowered becomes shorter as the illuminance of the illumination light L becomes intenser. A characteristic curve as shown in FIG. 6 can be obtained by plotting the curve indicating the relation between the time for the output signal $V_{OUT}$ to be inverted and the illuminance obtained as the result of above experiments and drawing a graph. That is, it is clearly seen from FIG. 6 that a constant relation as indicated by the curve lies between the illuminance of the illumination light L applied to the photosensor 10 and the time for the output signal $V_{OUT}$ of the photosensor 10 to be inverted.

Therefore, it becomes possible to detect the illuminance of the illumination light L applied to the photosensor 10 by measuring the time for the output signal $V_{OUT}$ to be inverted by utilizing the relation between the illuminance start time and the time for the output signal $V_{OUT}$ to be inverted and derive a gradation signal based on the time for inversion.

Figure 7:
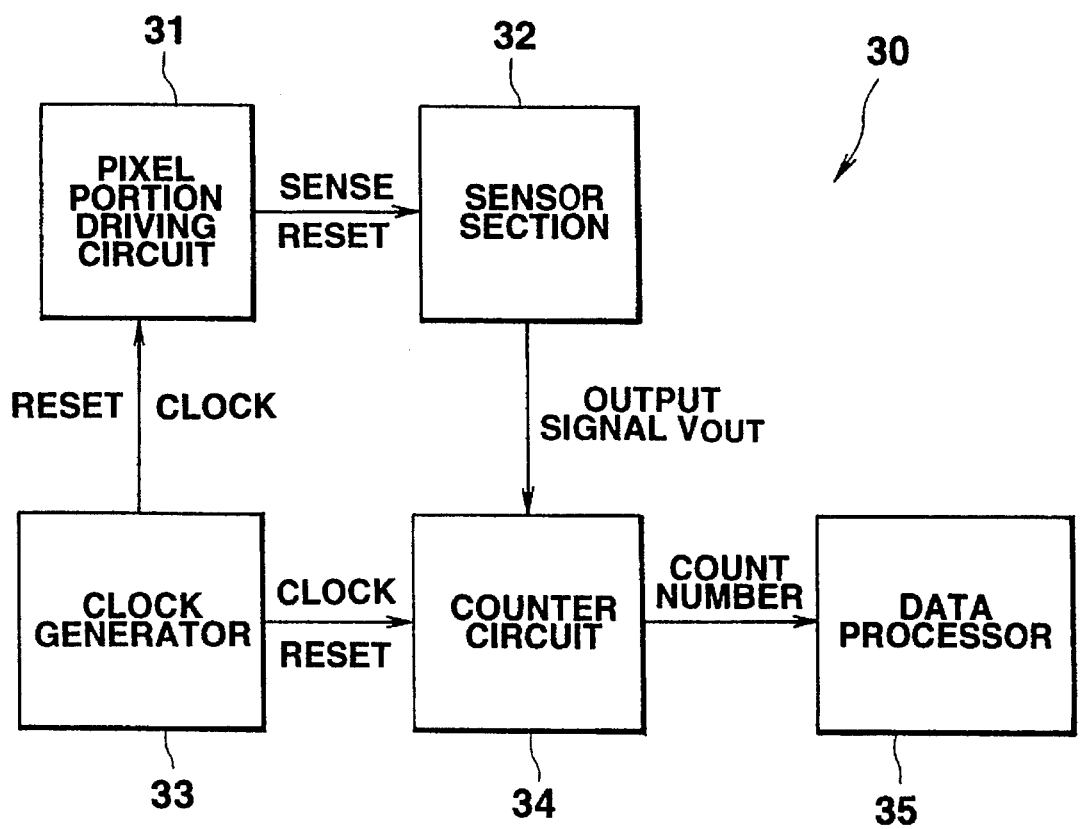
FIG. 7 is a block diagram of the entire circuit showing the first embodiment of a photoelectric conversion system according to this invention.
Figure 8:
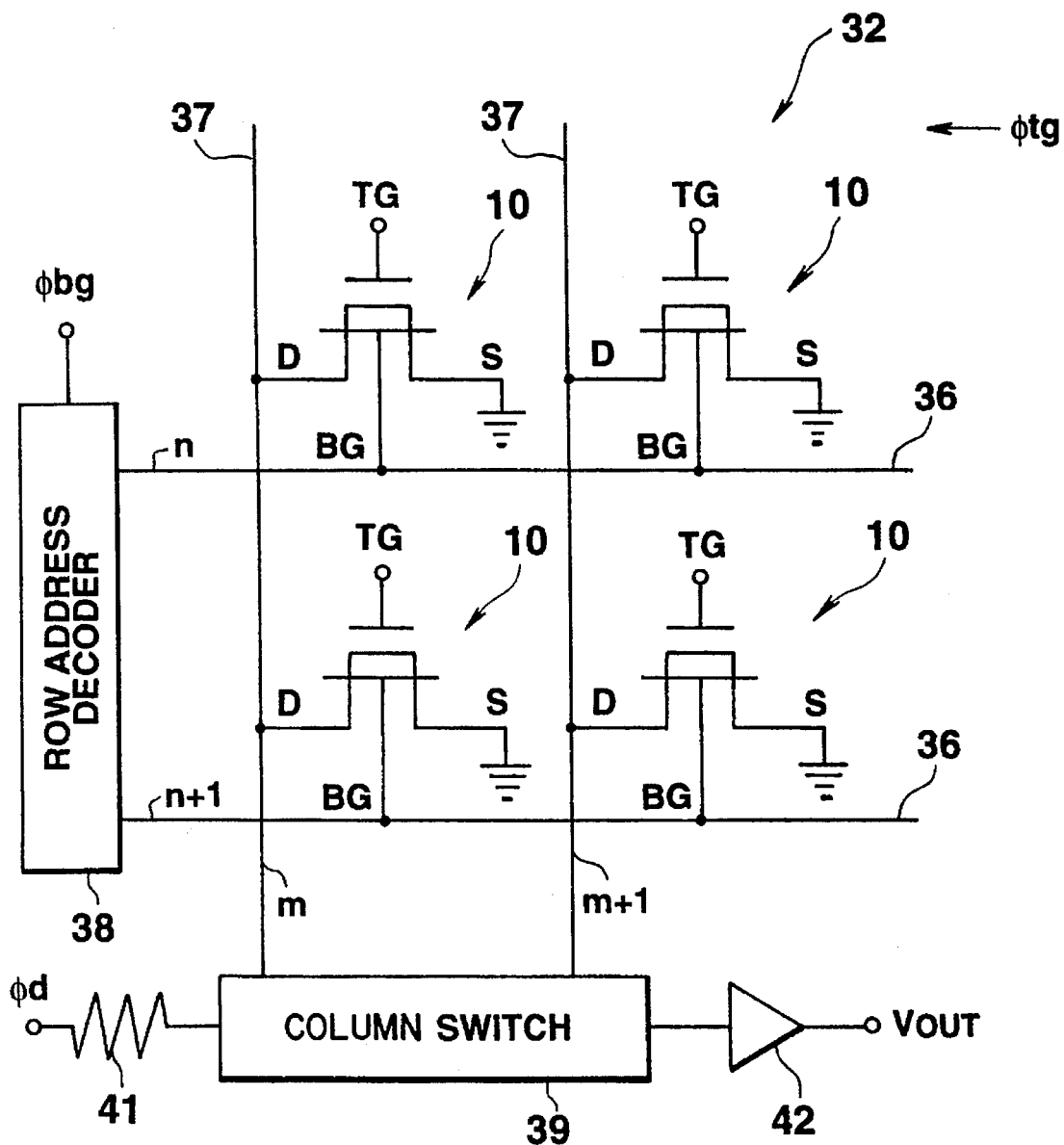
FIG. 8 is a diagram concretely showing a pixel portion driving circuit and a sensor section shown in FIG. 7.
Figure 9:
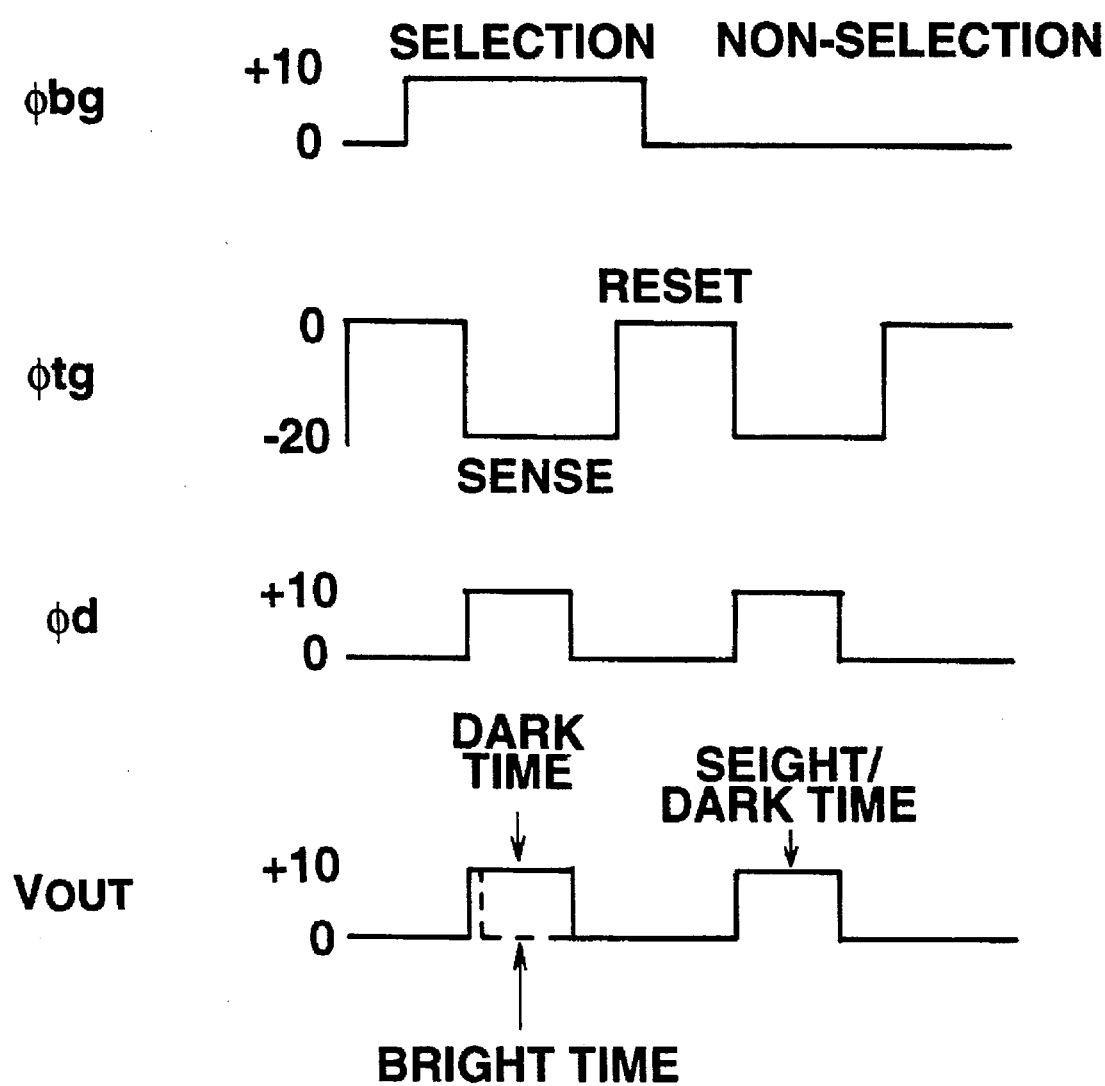
FIG. 9 is a timing chart showing the relation between signals supplied to various portions of the sensor section of FIG. 8 and an output signal.

FIGS. 7 to 9 show an example of a photosensor system which can derive a gradation signal by utilizing the property of the photosensor 10.

In FIG. 7, a photosensor system 30 includes a pixel portion driving circuit 31, sensor section 32, clock generator 33, counter circuit 34, and data processor 35.

As shown in FIG. 8, a large number of photosensors 10 are arranged in a matrix form in the sensor section 32 and n-th and (n+1)-th photosensors 10 which are arranged in the row direction and m-th and (m+1)-th photosensors 10 which are arranged in the column direction are shown in FIG. 8. In the photosensor 10 shown 10 in FIG. 8, TG denotes a top gate, BG denotes a bottom gate, S denotes a source and D denotes a drain. In each of the photosensors 10, the bottom gate BG thereof is connected to a corresponding one of driving lines 36 arranged in the row direction and the drain D thereof is connected to a corresponding one of signal lines 37 arranged in the column direction.

As shown in FIG. 8, the pixel portion driving circuit 31 includes a row address decoder 38 which is a vertical scanning circuit connected to the driving lines 36 of the sensor section 32, and a column switch 39 which is a horizontal scanning circuit connected to the signal lines 37 of the sensor section 32. The row address decoder 38 applies bottom gate voltages $\phi_{bg}$ to the bottom gates BG of the photosensors 10 arranged on the respective rows via the corresponding driving lines 36. The column switch 39 is supplied with a drain voltage $\phi_d$ via a pull-up resistor 41 and an output signal $V_{OUT}$ is output from the column switch 39 via a buffer 42. That is, the pull-up resistor 41 is connected in series with the signal lines 37 and a value of the resistance ratio with the output resistance of each of the photosensors 10 is input to the next-stage buffer. Further, although not shown in FIG. 8, the pixel portion driving circuit 31 includes a voltage supply circuit for applying a top gate voltage $\phi_{tg}$ to the top gate TG of the photosensor 10 and the source S of the photosensor 10 is grounded.

The clock generator 33 includes an oscillation circuit and a frequency dividing circuit, and a reset signal and a clock signal of preset frequencies are output from the clock generator 33 to the pixel portion driving circuit 31 and counter circuit 34. The pixel portion driving circuit 31 outputs a top gate voltage $\phi_{tg}$ and bottom gate voltage $\phi_{bg}$ as a sense signal and reset signal to the sensor section 32 according to the clock signal and reset signal supplied from the clock generator 33 to drive the photosensors 10 of the sensor section 32.

The counter circuit 34 is supplied with an output signal $V_{OUT}$ from the sensor section 32 and the counter circuit 34 counts a clock signal input from the clock generator in a period from the time that a reset signal is input from the clock generator 33 until an output signal $V_{OUT}$ from the sensor section 32 is inverted and outputs a count number to the data processor 35.

The data processor 35 includes a CPU (Central Processing Unit), RAM (Random Access Memory) and ROM (Read Only Memory) and a table indicating the relation between the illuminance and the time for the output signal $V_{OUT}$ to be inverted shown in FIG. 6 or data indicating the relation between gradation data and the time for the output signal $V_{OUT}$ to be inverted and a program for the photosensor system 30 are previously stored in the RAM or ROM. While controlling the operation of the sensor section 32, the data processor 35 searches the ROM based on the count number input from the counter circuit 34 to directly convert the input data into gradation data or searches the ROM based on the count number to convert the input data into illuminance and convert the illuminance into gradation data.

With the above circuit construction, the selection/non-selection state and the sense/reset state are controlled by controlling the bottom gate voltage $\phi_{bg}$, top gate voltage $\phi_{tg}$ and drain voltage $\phi_d$ of each of the photosensors 10 and the time for the output signal $V_{OUT}$ of the selected photosensor to be inverted is measured by use of the counter circuit 34 and the count number is converted into gradation data.

That is, the pixel portion driving circuit 31 outputs a sense signal and reset signal to the sensor section 32 according to the reset signal and clock signal output from the clock generator 33, and as shown in FIG. 9, if the top gate voltage $\phi_{tg}$ is set to −20 V and the bottom gate voltage $\phi_{bg}$ is set to 10 V after the top gate voltage $\phi_{tg}$ of a photosensor 10 is set to 0 V to set the photosensor 10 into the reset state, the photosensor 10 is set into the selection state and sense state. If, in this state, a drain voltage $\phi_d$=+10 V is supplied to the respective signal lines 37 via the column switch 39 to effect the data readout operation, the value of an output signal $V_{OUT}$ varies according to whether the illumination light L is applied or not, that is, whether it is bright time or dark time.

That is, if it is bright time, electron-hole pairs are induced in the semiconductor layer 15 of the photosensor 10 by application of the illumination light L as described before and an n-channel is formed in the semiconductor layer 15, thus permitting a current to flow from the drain D to the source S. As a result, the drain voltage $\phi_d$ charged on the signal line 37 is lowered and the output signal $V_{OUT}$ decreases with a decrease of the drain voltage and inverted as shown by broken lines in FIG. 9. As is explained with reference to FIG. 6, the time required for inversion has a particular relation with the illuminance of illumination light L. Further, if it is dark time, the photosensor 10 is not turned on so that a voltage of +10 V which is the drain voltage $\phi_d$ is continuously output as it is as an output signal $VOU_T$.

The counter circuit 34 counts the period from the time that the state is changed from the reset state to the sense state until the output signal $V_{OUT}$ is inverted and the count number is output to the data processor 35. The data processor 35 converts the count number supplied from the counter circuit 34 into corresponding gradation data and uses the data as gradation display data or the like.

Thus, since the period from the time that the state is changed from the reset state to the sense state until the output signal $V_{OUT}$ is inverted is counted by using inversion of the output signal $V_{OUT}$ of the photosensor 10 and gradation data is derived based on the count number, it can be made free from the influence by noise unlike the conventional case, the peripheral circuit can be made simple in construction and small in size, and precise gradation data corresponding to the illuminance of the illumination light L can be derived.

After this, when the top gate voltage $\phi_{tg}$ is set to 0 V as shown in FIG. 9, the photosensor 10 is reset. Then, when the bottom gate voltage $\phi_{bg}$ is set to 0 V, the photosensor 10 is set into the non-selection state, and in this state, if the top gate voltage $\phi_{tg}$ is set to −20 V, the sense state is set up. In the sense state, the drain voltage $\phi_d$ is set to +10 V and the output signal $V_{OUT}$ is set to +10 V which is the same as an output at the dark time in the selection state irrespective of whether the illumination light L is applied or not. That is, even if the top gate voltage $\phi_{tg}$ is set to −20 V to set up the sense state, the photosensor 10 can be set into the non-selection state irrespective of application of the illumination light L by setting the bottom gate voltage $\phi_{bg}$ to 0 V. Further, as is clearly seen from FIG. 9, the reset state can be set up irrespective of the bottom gate voltage $\phi_{bg}$ by setting the top gate voltage $\phi_{tg}$ to 0 V and an output signal $V_{OUT}$ can be stably derived from the photosensor 10 in the data readout process.

In the above embodiment, as shown in FIG. 9, the state switching timing is determined such that the state is changed from the reset state to the sense state after the photosensor 10 is set into the selection state and application of the illumination light L is already effected at the time when the state is switched to the reset state. However, the state switching timings and the timings of application of the illumination light L are not limited to those used in the above embodiment, but the state may be switched from the non-selection state to the selection state by setting the bottom gate voltage φbgto +10 V after the sense state shown in FIG. 9 is set up, for example, when the operation of controlling the state switching timing is effected and if application of the illumination light L is started in a condition that the sense state and non-selection state are set, electron-hole pairs start to be induced in the semiconductor layer 15 in the sense state and non-selection state set when application of the illumination light L is started so that a time period from the time the selection state is set up until the output signal $V_{OUT}$ is inverted can be reduced. At this time, if the time from the set-up of the selection state to the inversion of the output signal $V_{OUT}$ is counted by the counter circuit 34, time for the counting operation of the counter circuit 34 can be reduced. In this case, the timing of application of the illumination light L is so determined that the output signal $V_{OUT}$ will be inverted within the selection state even after non-selection state when the maximum amount of illumination light L is applied.

Further, the above measurement time can be reduced by increasing the amount of illumination light L.

In the above embodiment, a period from the reset time to the time of inversion of the output signal $V_{OUT}$ is measured, but this is not limitative and it is possible to measure a time period for the output signal $V_{OUT}$ to change from a preset value, for example, 9 V in FIG. 4 to another preset value, for example, 2 V in FIG. 4 while the illumination light L is being applied.

Figure 14:
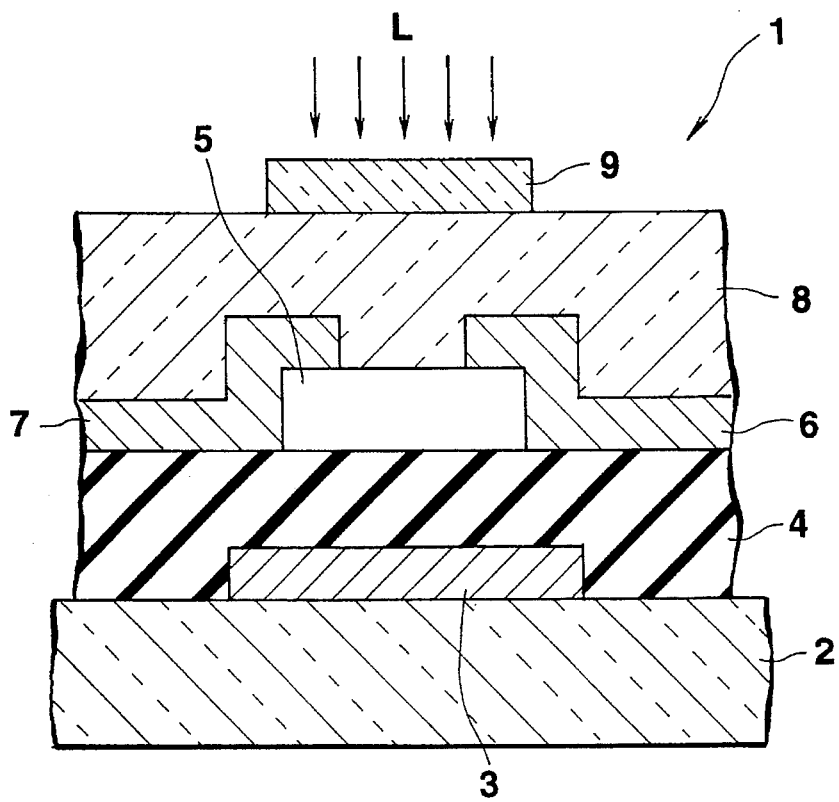
FIG. 14 is an enlarged cross sectional view showing one example of a photosensor used in the conventional photoelectric conversion system.
Figure 15:
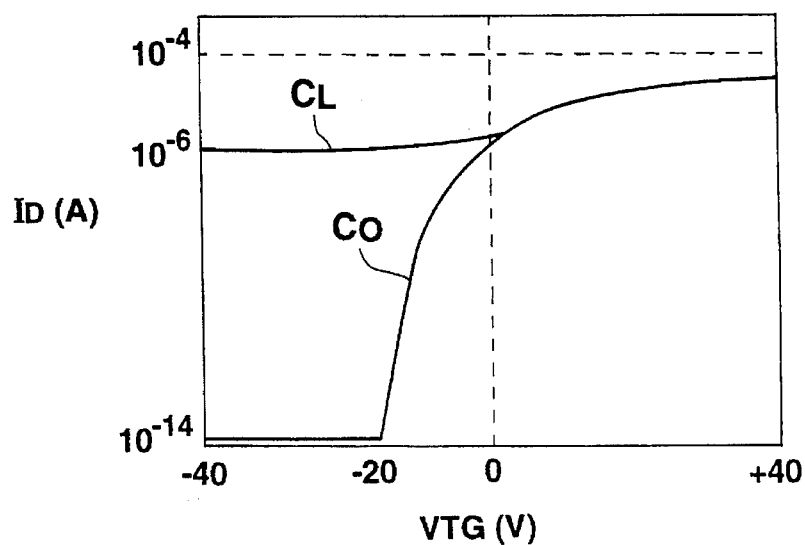
FIG. 15 is a characteristic diagram showing the characteristic between the top gate voltage VTG and the drain current $I_D$ at the time of light illumination and no light illumination in the photosensor shown in FIG. 14.

Further, since the photosensor system according to this invention measures the time required for inversion of the output signal $V_{OUT}$ to detect an amount of illumination light as described above, this invention can be applied not only to the photosensor 1 shown in FIG. 14, but also to photoelectric conversion devices such as photodiodes and MOS photocells generally used in the prior art.

The time required for inversion of the output signal $V_{OUT}$ can be measured by use of a simpler method. The method is described below.

[Second Embodiment]

Figure 10:
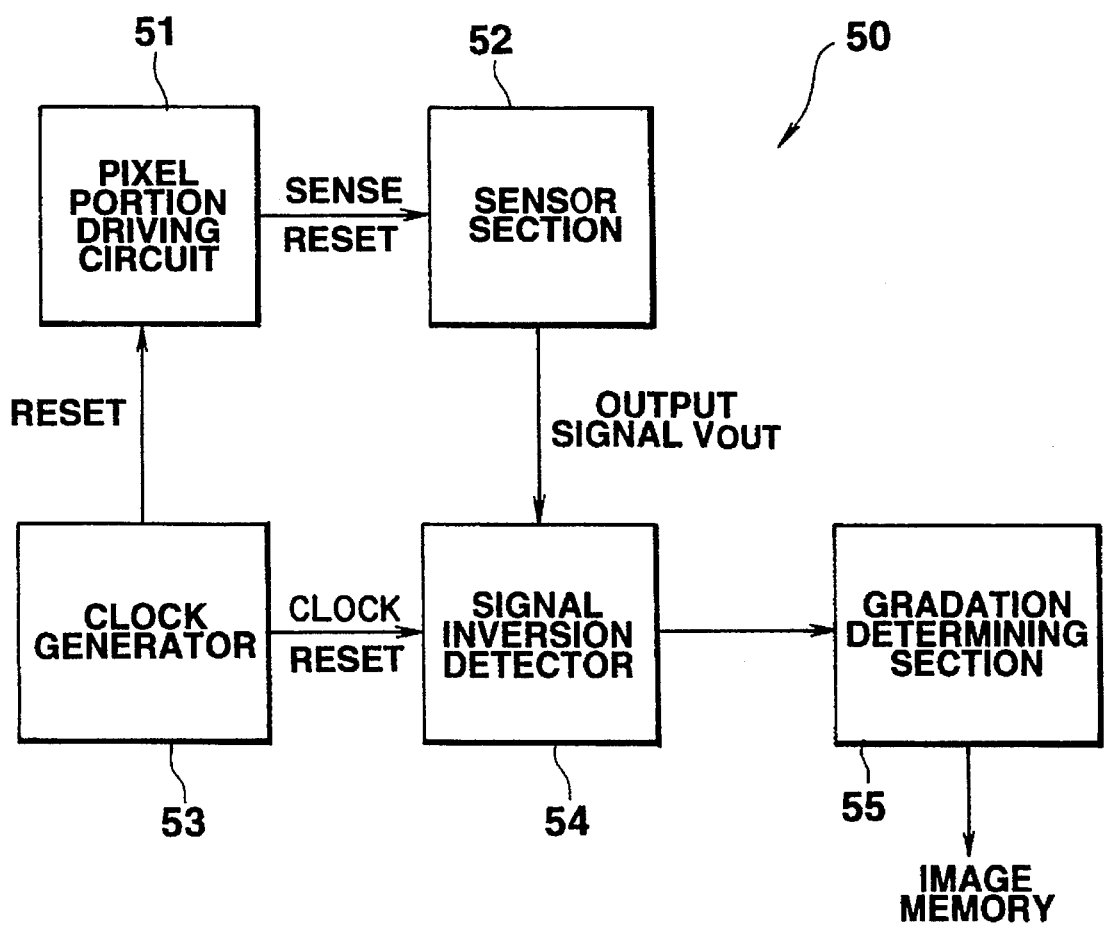
FIG. 10 is a block diagram of the entire circuit showing a second embodiment of a photoelectric conversion system according to this invention.

A photosensor system 50 shown in FIG. 10 includes a pixel portion driving circuit 51, sensor section 52, clock generator 53, signal inversion detector 54 and gradation determining section 55.

Figure 11:
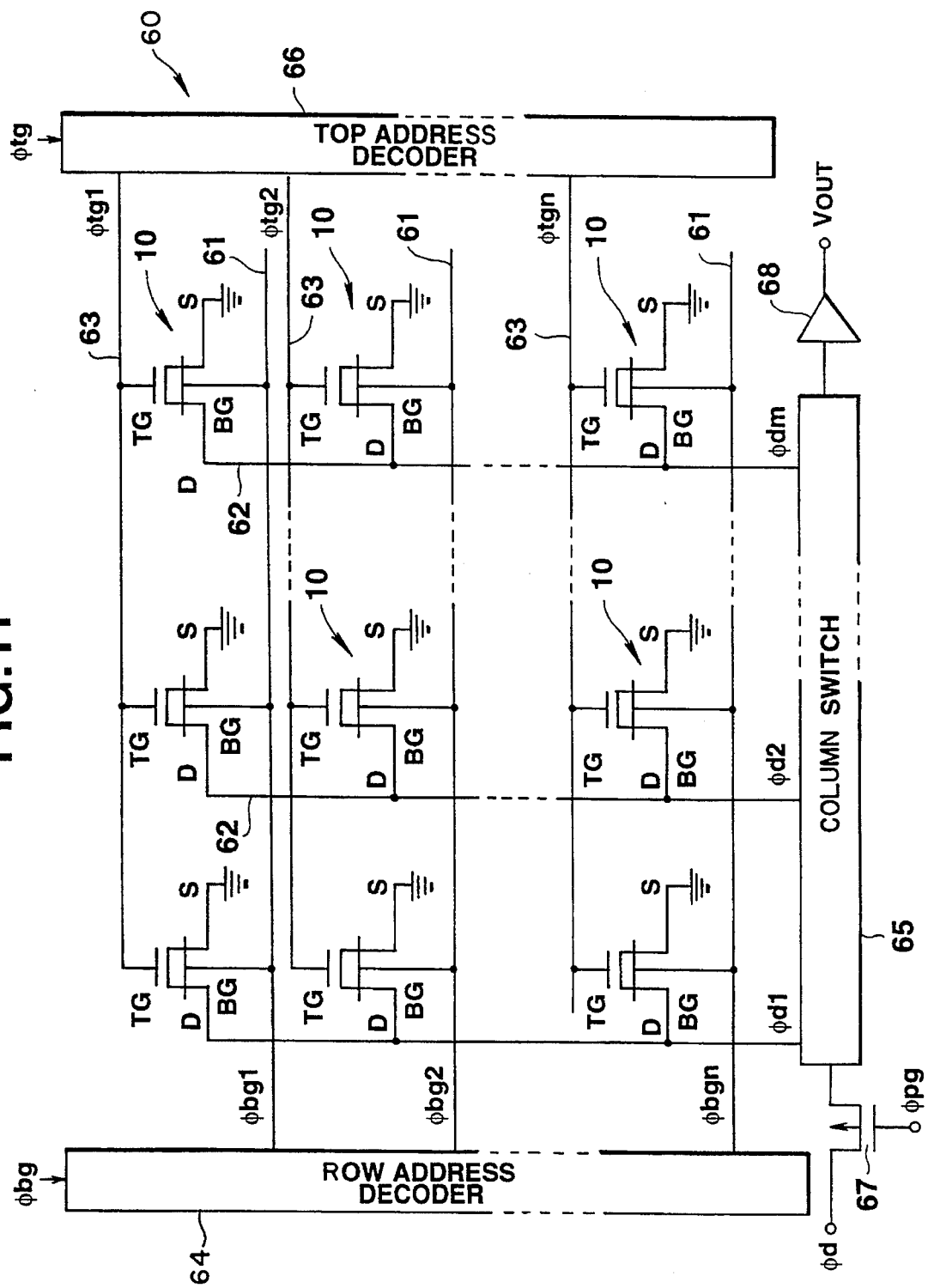
FIG. 11 is a diagram concretely showing a pixel portion driving circuit and a sensor section shown in FIG. 10.

The sensor section 52 and clock generator 53 are the same as those of the first embodiment. The pixel portion driving circuit 51 has basically the same construction as that of the first embodiment, but for convenience of explanation, the construction thereof which is partly changed is shown in FIG. 11.

The pixel portion driving circuit 51 includes a row address decoder 64 which is a vertical scanning circuit connected to driving lines 61 of the sensor section 52, a column switch 65 which is a horizontal scanning circuit connected to signal lines 62 of the sensor section 52, and a top address decoder 66 connected to top gate lines 63 of the sensor section 52.

The row address decoder 64 apply bottom gate voltages φBG1 to φBGn to the bottom gate electrodes BG of the photosensors 10 arranged on the respective rows via the respective driving lines 61.

The column switch 65 is supplied with a drain voltage $\phi_d$ via a precharge transistor 67 and an output signal $v_{OUT}$ is output from the column switch 65 via a buffer 68. That is, the column switch 65 outputs an output of each of the photosensors 10 connected to the corresponding signal lines 62 as an output signal $V_{OUT}$ via the buffer 68 each time a precharge voltage $\phi_{pg}$ is applied to the precharge transistor 67 to turn on the precharge transistor 67.

The top address decoder 66 applies top gate voltages φTG1 to φTGn to the top gate electrodes TG of the photosensors 10 arranged on the respective rows via the corresponding top gate lines 63.

The signal inversion detector 54 comprises a counter which is supplied with an output signal $V_{OUT}$ from the sensor section 52, counts the number of clock signals input from the clock generator 53 during a period of time from the output signal Vout is held to more than a predetermined voltage set at a logical inversion level at which the logical level is inverted from high to low level, that is, in a sense time ] of the photosensor 10 as will be described later, and outputs the count number and address data of the photosensor 10 whose output signal $V_{OUT}$ is inverted to the gradation determining section 55.

The gradation determining section 55 includes a CPU (Central Processing Unit), RAM (Random Access Memory) and ROM (Read Only Memory) and a table indicating the relation between time (critical sense time τ) for the output signal $V_{OUT}$ to be inverted and gradation data and a program for the photosensor system 50 are previously stored in the RAM or ROM. While controlling the operation of the sensor section 52, the gradation determining section 55 searches the ROM based on the count number input from the signal inversion detector 54 to directly convert the input data into gradation data and output the converted gradation data to an image memory (not shown).

Figure 12:
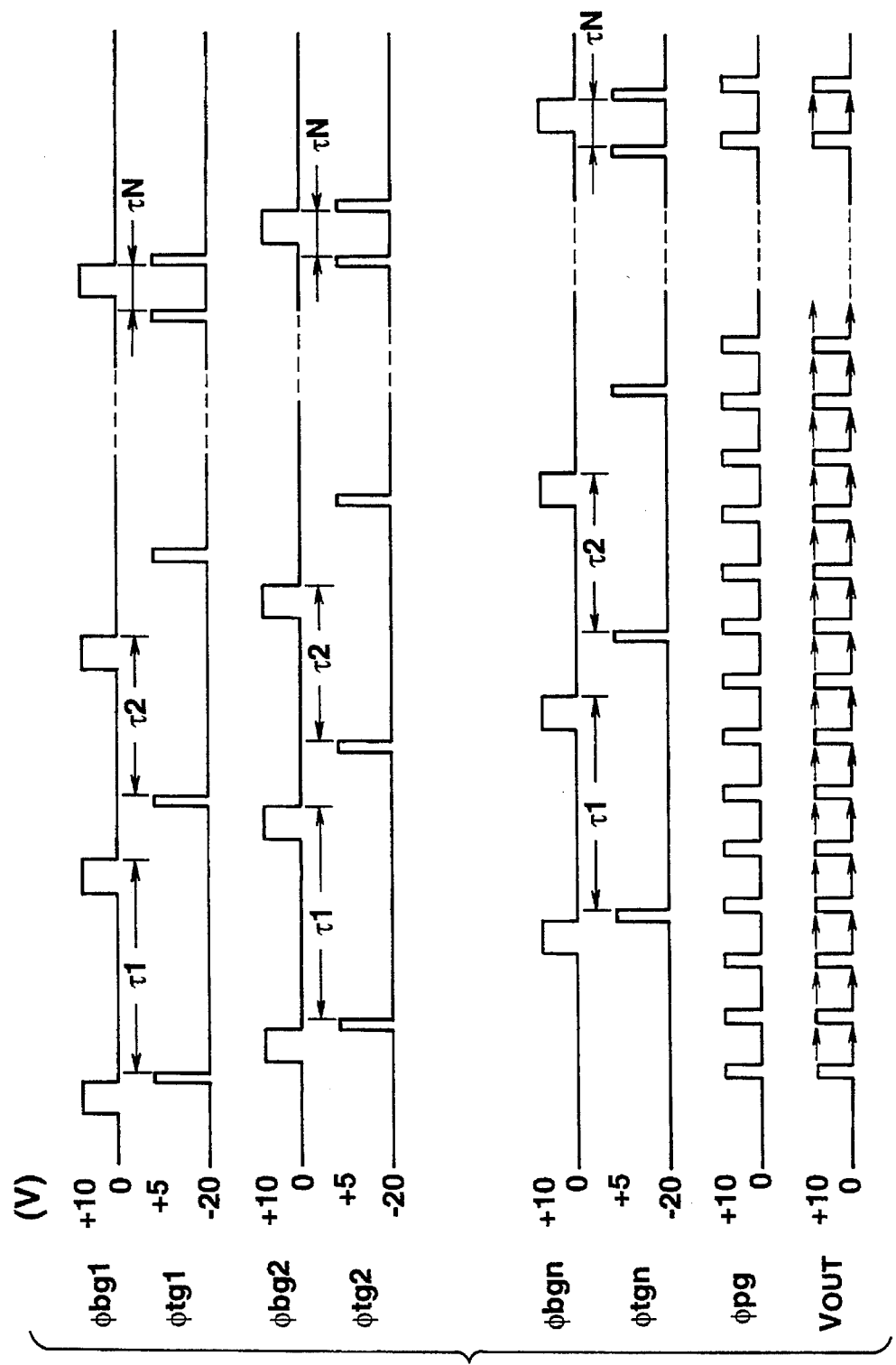
FIG. 12 is a timing chart showing the relation between signals supplied to various portions of the sensor section of FIG. 11 and an output signal.

FIG. 12 is a timing chart showing an output signal and application voltages on various portions of the photosensor array 60 and the system operation is explained below with reference to FIG. 12.

As shown in FIG. 1, the drain electrode 17 of the photosensor 10 is mounted on the insulating film 14 of silicon nitride, for example. Accordingly, as shown in FIGS. 8 and 11, the signal lines 37 and 62 are also formed on the silicon nitride film 14 (which is a dielectric material). When a voltage is applied on the signal lines 37 and 62, charges are stored in the silicon nitride (dielectric film) 14. This stored voltage is held for a predetermined period of time. In other words, when a precharge signal is applied to the signal lines 37 and 62, these signal lines 37 and 62 are precharged and the charges are held for a predetermined period of time.

In the photosensor system 50, the bottom gate voltage $\phi_{bg}1$ of each of the photosensors 10 connected to the first row is set to 0 V and the top gate voltage $\phi_{tg}1$ is set to +5 V to reset the photosensors and a precharge voltage $\phi_{pg}$ is applied to the precharge transistor 67 for a preset period of time in the reset state so as to apply drain voltages $\phi_d1$ to $\phi_dm$ to the respective signal lines 62 and thus precharge the signal lines. After this, the top gate voltage $\phi_{tg}1$ is set to –20 V to set the corresponding photosensors 10 into the sense state and then the bottom gate voltage $\phi_{bg}1$ is set to +10 V in the period of sense state (sense time $\tau$) to set the corresponding photosensors 10 into the selection state. When the photosensor 10 is set in the selection state, the output signal $V_{OUT}$ thereof is set to 0 V or kept at +10 V according to the length of preset sense time $\tau1$ and an amount of illumination light (light amount) in the sense time $\tau1$.

The above operation is repeatedly effected while sequentially changing the bottom gate voltage and top gate voltage from the bottom gate voltage $\phi_{bg}1$ and top gate voltage $\phi_{tg}1$ to the bottom gate voltage $\phi_{bg}n$ and top gate voltage $\phi_{tg}n$, that is, by sequentially operating the photosensors 10 arranged in a matrix form from the first row to the n-th row for the same sense time $\tau1$ for each row, and output signals $V_{OUT}$ of the photosensors 10 connected to a corresponding one of the rows are sequentially output to the signal inversion detector 54 via the column switch 65 and buffer 68.

After the above operation is effected for the first row to the n-th row, the reset state is set up, and then, as shown in FIG. 9, the sense time $\tau$ is set to sense time $\tau2$ which is shorter than the sense time $\tau1$ by a preset time, and the same operation as described above is repeatedly effected for the first row to the n-th row by using the sense time $\tau2$. Output signals $V_{OUT}$ of the photosensors 10 obtained at this time are output to the signal inversion detector 54.

Likewise, the same operation as described above is repeatedly effected while sequentially reducing the sense time by a preset time and thus the operation is repeatedly effected by a preset number of times. The repetition number is set to at least a value larger than the number of gradation levels to be displayed.

Thus, when output signals $V_{OUT}$ of the photosensors 10 are sequentially input to the signal inversion detector 54, the signal inversion detector 54 detects that the output signal $V_{OUT}$ is inverted or not for each photosensor 10, counts the clock signal input from the clock generator 53 in the sense time $\tau$, and outputs the count number and address data of the photosensor 10 whose output signal $V_{OUT}$ is inverted to the gradation determining section 55. As described before, time for the output signal $V_{OUT}$ of the photosensor 10 to be inverted depends on an amount of illumination light applied to the photosensor 10 and the count number obtained by counting the clock signal from the clock generator 53 corresponds to an amount of illumination light applied to the photosensor 10.

The gradation determining section 55 searches the table indicating the relation between gradation data and critical sense time stored in the built-in ROM according to the smallest one of the count numbers input from the signal inversion detector 54, or the count number selected when the sense time for inversion is minimum, converts the count number into gradation data and outputs the converted gradation data to an image memory (not shown).

Thus, an amount of illumination light (gradation degree) is detected according to the critical sense time $\tau$ for the output signal $V_{OUT}$ of the photosensor 10 to be inverted by alternately setting the photosensor 10 into the sense state and non-sense state, changing the length of the sense time $\tau$ in the sense state, and repeatedly effecting the detection operation for detecting the critical sense time $\tau$ for the output signal $V_{OUT}$ of the photosensor 10 to be inverted. Therefore, the light amount (gradation degree) can be derived in the form of digital signal and the light amount (gradation degree) can be precisely detected without providing an amplifying circuit in the external portion. As a result, gradation display can be attained with high precision.

Figure 13:
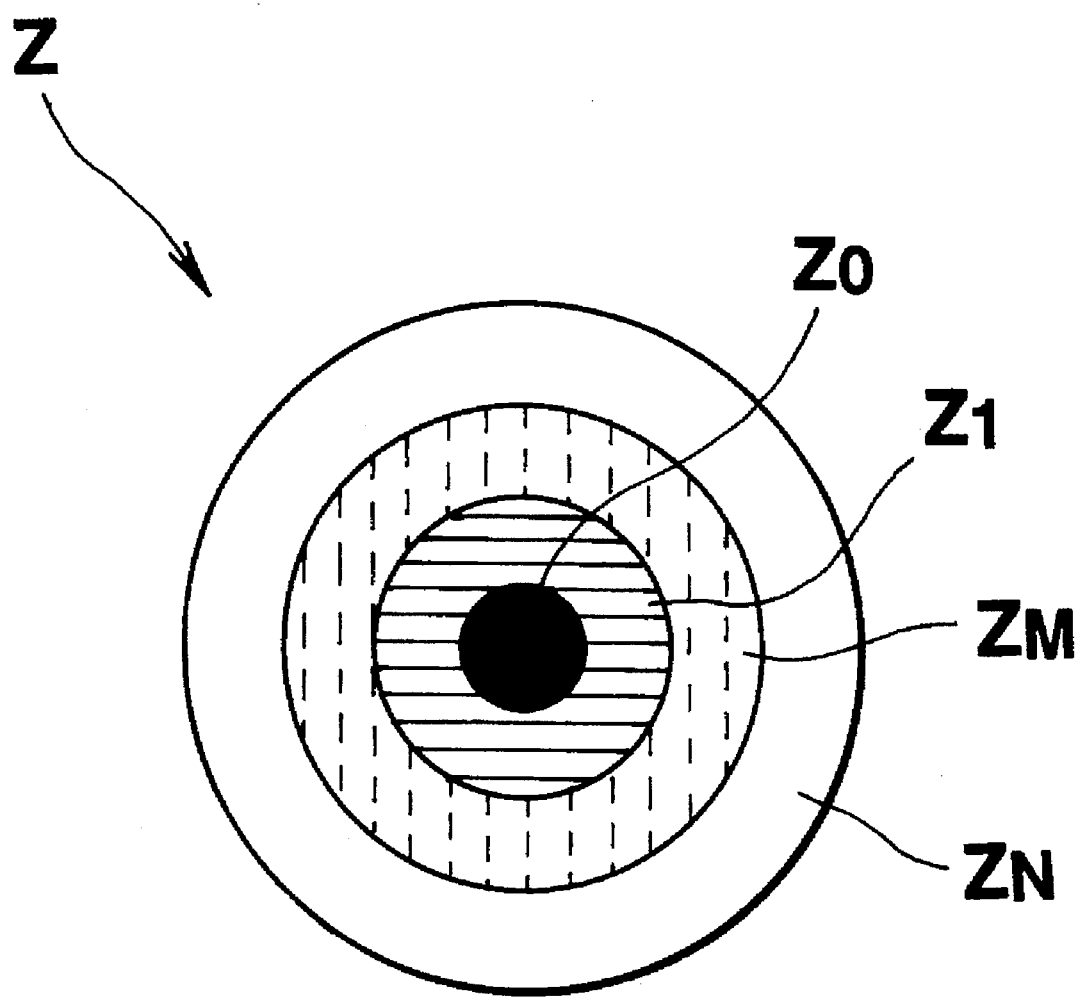
FIG. 13 is a representative display pattern diagram for illustrating the operation of the photoelectric conversion system effected to detect an amount of illumination light by use of the photoelectric conversion system shown in FIG. 10.

FIG. 13 shows a pattern having concentric circles of white area $Z_N$, light gray area $Z_M$, dark gray area $Z_1$ and black area $Z_O$ arranged in a direction from the outer circumference to the center. Assuming that the concentric circles are detected by use of the photosensor 50 of this invention, the operation of the photosensor 50 is explained.

An output signal $V_{OUT}$ from the photosensor 10 corresponding to the white area $Z_N$ is detected to be inverted in all of the detecting operations from the first detecting operation (sense time $\tau_1$) to the final detecting operation (the shortest sense time $\tau_N$), for example. An output signal $V_{OUT}$ from the photosensor 10 corresponding to the light gray area $Z_M$ is detected to be inverted in all of the detecting operations from the first detecting operation (sense time $\tau_1$) to the (N–1)-th detecting operation (the second shortest sense time $\tau_{N-1}$), for example. Further, an output signal $VOU_T$ from the photosensor 10 corresponding to the dark gray area $Z_1$ is detected to be inverted in the first detecting operation (sense time $\tau_1$) and the second detecting operation (sense time $\tau_2$), for example. An output signal $V_{OUT}$ from the photosensor 10 corresponding to the black area $Z_0$ is detected to be inverted only in the first detecting operation (sense time $\tau_1$), for example. Therefore, the shortest one of the sense times $\tau$ required for detecting the inversion of the output signal $V_{OUT}$ of each of the photosensors 10 can be treated as an amount of illumination light applied to the photosensor 10. In the above-described case, $\tau_N$ is detected for the white area $Z_N$, $\tau_{N-1}$ is detected for the light gray area $Z_M$, $\tau_2$ is detected for the dark gray area $Z_1$, and $\tau_1$ is detected for the black area $Z_0$, and thus the sense times are correctly detected in an order from the bright area to the dark area.

In the above case, inversion of the output of the photosensor 10 is effected in the signal inversion detector 54 and the signal inversion detector 54 counts the clock signal input from the clock generator 53 in the shortest one of the sense times $\tau$ required for inversion of the output signal of the photosensor 10 and outputs the counting result and address data of the photosensor 10 whose output signal $V_{OUT}$ is inverted to the gradation determining section 55.

Further, in this case, the operation of detecting the output signal $V_{OUT}$ may be effected while sequentially changing the sense time $\tau$ from the shorter time to the longer time. Also, it is preferable to adequately change the variation time of the sense time $\tau$ in the respective detecting operations without keeping the variation time of the sense time $\tau$ constant so that the sense time $\tau$ can be set to correspond to the gradation display.

As described above, in this invention, the sense time $\tau$, that is, the time of application of illumination light to the photosensor 10 is gradually changed from the longer time to the shorter time, for example, the illumination light is applied to the photosensor 10 each time the sense time is set, and an amount of illumination light is detected based on the critical sense time $\tau_n$ for the output of the photosensor to be inverted, and therefore, gradation display can be attained with extremely high efficiency.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A photoelectric conversion system comprising:

a base;

a plurality of photosensors formed on said base, each photosensor including a photoelectric conversion semiconductor, a control electrode, an input electrode and an output electrode, said output electrode of each photosensor being connected to a ground potential;

a control line formed on said base and connected to control electrodes of a plurality of said photosensors;

a plurality of signal lines formed on said base and each signal line being connected to said input electrodes of a plurality of said photosensors;

switching means for supplying a precharge voltage to said signal lines before application of an illumination light, and for reading out a remaining voltage held on each of said signal lines after application of the illumination light; and time measuring means for measuring a time of said remaining voltage held on each of said signal lines to change from a predetermined high level voltage to a predetermined low level voltage, whereby the photoelectric conversion system converts the illumination light falling on each of said photosensors to an output signal having a pulse width corresponding to an intensity of the applied illumination light.

2. A photoelectric conversion system according to claim 1, wherein said time measuring means includes a clock generator and a counter circuit.

3. A photoelectric conversion system according to claim 1, wherein said time measuring means includes a clock generator and a signal inversion detector.

4. A photoelectric conversion system comprising:

a base;

a plurality of photosensors formed in a matrix on said base, said matrix having a group of columns and a group of rows, each of said photosensors including a photoelectric conversion semiconductor, a first control electrode, a second control electrode, an input electrode and an output electrode, said output electrode of each photosensor being connected to a ground potential;

a plurality of first control lines formed on said base parallel to a column direction, each of said first control electrodes of said photosensors in one column being connected to a same one of said first control lines;

a plurality of second control lines formed on said base parallel to a column direction, each of said second control electrodes of said photosensors in one column being connected to a same one of said second control lines;

a plurality of signal lines formed on said base parallel to a row direction, each of said input electrodes of said photosensors in one row being connected to a same one of said signal lines;

first address means for selectively supplying a sense voltage and reset voltage to said first control lines;

second address means for selectively supplying a selection voltage and a non-selection voltage to said second control lines;

switching means for supplying a precharge voltage to each of said signal lines before application of an illumination light, and for reading out a remaining voltage held on each of said signal lines after application of the illumination light; and time measuring means for measuring a time of said remaining voltage held on each of said signal lines to change from a predetermined high level voltage to a predetermined low level voltage, whereby the photoelectric conversion system converts the illumination light falling on each of said photosensors to an output signal having a pulse width corresponding to an intensity of the applied illumination light.

5. A photoelectric conversion system according to claim 4, wherein the time measurement by said time measuring means is effected in a condition that different voltages are applied to said first gate electrode and to said second gate electrode of said photosensor.

6. The photoelectric conversion system according to claim 5, wherein said voltages applied to said first control electrode and to said second control electrode have opposite polarities.

7. The photoelectric conversion system according to claim 4, wherein said base comprises an electrically insulating substrate.

8. The photoelectric conversion system according to claim 4, wherein said base is made of glass.

9. The photoelectric conversion system according to claim 4, wherein said first control electrode is transparent.

10. The photoelectric conversion system according to claim 4, wherein said second control electrode is transparent.

11. A process for converting an energy beam to an electrical signal, comprising:

a preparing step of preparing an energy conversion device including a plurality of photosensors having photoelectric conversion semiconductors, first control electrodes, second control electrodes, input electrodes, output electrodes connected to a ground potential, a first control line connected to said first control electrodes, a second control line connected to said second electrodes, and a plurality of signal lines each of which is connected to at least one of said input electrodes;

a precharge step of supplying a precharge voltage to each of said signal lines;

a sensing step of supplying a sense level voltage to each of said first control electrodes through said first control line, and a selection level voltage to each of said second control electrodes through said second control line while applying an energy beam to said energy conversion device;

a reading out step of reading out a remaining voltage held on each of said signal lines; and a time measuring step of measuring a time for said remaining voltage held on each of said signal lines to change from a predetermined high level voltage to a predetermined low level voltage.

12. A process for converting an energy beam to an electrical signal, comprising:

a preparing step of preparing an energy conversion device including a plurality of photosensors having photoelectric conversion semiconductors, control electrodes, input electrodes, output electrodes connected to a ground potential, a control line connected to said control electrodes, and a plurality of signal lines each of which is connected to at least one of said input electrodes;

a first sequential series of steps including:
- a first precharge step of supplying a precharge voltage to each of said signal lines,
- a first sensing step of supplying a sense level voltage to each of said control electrodes through said control line, while applying an energy beam to said energy conversion device during a first predetermined period of time,
- a first reading out step of reading out a remaining voltage held on each of said signal lines, and
- a first detecting step of detecting whether or not said remaining voltage after said first sensing step is at a predetermined low level voltage or less;

a reset step of supplying a reset level voltage to each of said control electrodes through said control line;

a second sequential series of steps including:
- a second precharge step of supplying a precharge voltage to each of said signal lines,
- a second sensing step of supplying a sense level voltage to each of said control electrodes through said control line, while applying an energy beam to said energy conversion device during a second predetermined period of time, said second predetermined period of time being different from said first predetermined period of time,
- a second reading out step of reading out a remaining voltage held on each of said signal lines, and
- a second detecting step of detecting whether or not said remaining voltage after said second sensing step is at a predetermined low level voltage or less; and a determining step of determining an intensity of the energy beam falling on each of said photosensors according to a critical time defined by said first and second sequential series of steps.

* * * * *